United States Patent [19]
Holonyak, Jr. et al.

[11] Patent Number: 5,550,081
[45] Date of Patent: Aug. 27, 1996

[54] METHOD OF FABRICATING A SEMICONDUCTOR DEVICE BY OXIDIZING ALUMINUM-BEARING 1H-V SEMICONDUCTOR IN WATER VAPOR ENVIRONMENT

[75] Inventors: Nick Holonyak, Jr., Urbana; Steven A. Maranowski, Champaign, both of Ill.; Fred A. Kish, San Jose, Calif.

[73] Assignee: Board of Trustees Of The University Of Illinois, Ill.

[21] Appl. No.: 414,432

[22] Filed: Mar. 31, 1995

Related U.S. Application Data

[63] Continuation of Ser. No. 224,838, Apr. 8, 1994.
[51] Int. Cl.$^6$ ............................................. H01L 21/20
[52] U.S. Cl. .................. 437/129; 437/127; 437/126; 437/133; 437/23; 437/184; 437/905
[58] Field of Search ............................ 437/127, 126, 437/129, 133, 23, 184, 905

[56] References Cited

U.S. PATENT DOCUMENTS

| | | | |
|---|---|---|---|
| 4,172,906 | 10/1979 | Pancholy | 427/82 |
| 4,176,206 | 11/1979 | Inoue | 427/82 |
| 4,291,327 | 9/1981 | Tsang | 357/52 |
| 4,378,255 | 3/1983 | Holonyak, Jr. et al. | 148/1.5 |
| 4,511,408 | 4/1985 | Holonyak, Jr. | 148/1.5 |
| 4,563,368 | 1/1986 | Tihanyi et al. | 427/82 |
| 4,639,275 | 1/1987 | Holonyak, Jr. | 148/1.5 |
| 4,817,103 | 3/1989 | Holonyak, Jr. et al. | 372/45 |
| 5,031,186 | 7/1991 | Takigawa et al. | 372/49 |
| 5,262,360 | 11/1993 | Holonyak, Jr. et al. | 437/237 |
| 5,284,798 | 2/1994 | Ibuka et al. | 437/184 |
| 5,373,522 | 12/1994 | Holonyak, Jr. et al. | 372/45 |
| 5,403,775 | 4/1995 | Holonyak, Jr. et al. | 437/129 |

FOREIGN PATENT DOCUMENTS 642318 1/1989 Japan .

OTHER PUBLICATIONS

J. M. Dallesasse, N. Holonyak, Jr., A. R. Sugg, T. A. Richard, & N. El–Zein, "Hydrolization Oxidation of $Al_xGa_{1-x}As$–AlAs–GaAs Quantum Well Heterostructures And Superlattices", Appl. Phys. Lett. 57, 2844, Dec. 24, 1990.

J. M. Dallesasse & N. Holonyak, Jr., "Native–Oxide Stripe–Geometry $Al_xGa_{1-x}As$–GaAs Quantum Well Heterostructure Lasers", Appl. Phys. Lett. 58, 394, Jan. 28, 1991.

J. M. Dallesasse, N. Holonyak, Jr., D. C. Hall, N. El–Zein A. R. Sugg, S. C. Smith, & R. D. Burnham, "Native–Oxide–Defined Coupled–Stripe $Al_xGa_{1-x}As$–GaAs Quantum Well Heterostructure Lasers", Appl. Phys. Lett. 58, 834, Feb. 25, 1991.

A. R. Sugg, N. Holonyak, Jr., J. E. Baker, F. A. Kish, & J. M. Dallesasse, "Native Oxide Stabilization of AlAs–GaAs Heterostructures", Appl. Phys. Lett. 58, 1199, Mar. 18, 1991.

F. A. Kish, S. J. Caracci, N. Holonyak, Jr., J. M. Dallesasse, A. R. Sugg, R. M. Fletcher, C. P. Kuo, T. D. Osentowski, & M. G. Craford, "Native–Oxide Stripe–Geometry $In_{0.5}(Al_xGa_{1-x})_{0.5}P$–$In_{0.5}Ga_{0.5}P$ Heterostructure Laser Diodes", Appl. Phys. Lett. 59, 354, Jul. 15, 1991.

(List continued on next page.)

*Primary Examiner*—R. Bruce Breneman
*Assistant Examiner*—Ramamohan Rao Paladugu
*Attorney, Agent, or Firm*—Martin M. Novack

[57] ABSTRACT

By implementing oxidation to obtain a native oxide of aluminum (581,582) after a device has been metallized (505,565), advantages can be obtained in device operation, reliability, and life. A method of making a semiconductor device is disclosed and includes the following steps: forming a structure comprising layers of III-V semiconductor material, at least one of the layers being an aluminum-beating III-V semiconductor material (530,550); applying metal electrodes (505,565) to the structure to form a medalist semiconductor structure; and heating the medalist structure in a water-containing environment to convert a portion of the aluminum-bearing III-V semiconductor material to a native oxide of aluminum (581,582).

24 Claims, 3 Drawing Sheets

OTHER PUBLICATIONS

N. El-Zein, N. Holonyak, Jr., F. A. Kish, A. R. Sugg, T. A. Richard, J. M. Dallesasse, S. C. Smith, & R. D. Burnham, "Native-Oxide-Masked Si Impurity-Induced Layer Disordering Of $Al_xGa_{1-x}As-Al_yGa_{1-y}As-Al_zGa_{1-z}As$ Quantum-Well Heterostructures", J. Appl. Phys. 70, 2031, Aug. 15, 1991.

F. A. Kish, S. J. Caracci, N. Holonyak, Jr., J. M. Dallesasse, K. C. Hsieh, M. J. Ries, S. C. Smith, & R. D. Burnham, "Planar Native-Oxide Index-Guided $Al_xGa_{1-x}As$-GaAs Quantum Well Heterostructure Lasers", Appl. Phys. Lett. 59, 1755, Sep. 30, 1991.

N. El-Zein, F. A. Kish, N. Holoynak, Jr., A. R. Sugg, M. J. Ries, S. C. Smith, J. M. Dallesasse, and R. D. Burnham, "Native-Oxide Coupled-Cavity $Al_xGa_{1-x}As$-GaAs Quantum Well Heterostructure Laser Diodes", Appl. Phys. Lett. 59, 2838, Nov. 25, 1991.

F. A. Kish, S. J. Caracci, N. Holonyak, Jr., and S. A. Maranowski, J. M. Dallesasse, R. D. Burnham, and S. C. Smith, "Visible Spectrum Native-Oxide Coupled-Stripe $In_{0.5}(Al_xGa_{1-x})_{0.5}P-In_{0.5}Ga_{0.5}P$ Quantum Well Heterostructure Laser Arrays", Appl. Phys. Lett. 59 2883, Nov. 25, 1991.

F. A. Kish, S. J. Caracci, N. Holonyak, Jr., P. Gavrilovic, K. Meehan, & J. E. Williams, "Coupled-Stripe In-Phase Operation Of Planar Native-Oxide Index-Guided $Al_yGa_{1-y}As$-GaAs-$In_xGa_{1-x}As$ Quantum-Well Heterostructure Laser Arrays", Appl. Phys. Lett. 60, 71, Jan. 6, 1992.

F. A. Kish, S. J. Caracci, S. A. Maranowski, N. Holonyak, Jr., K. C. Hsieh, C. P. Kuo, R. M. Fletcher, T. D. Osentowski, & M. G. Craford, "Planar Native-Oxide Buried-Mesa $Al_xGa_{1-x}As-In_{0.5}(Al_yGa_{1-y})_{0.5}P-In_{0.5}(Al_zGa_{1-z})_{0.5}P$ Visible-Spectrum Laser Diodes", J. Appl. Phys. 71, 2521, Mar. 15, 1992.

M. J. Ludowise, "Metalorganic Chemical Vapor Deposition Of III–V Semiconductors", J. Appl. Phys., 58, R31 1985.

G. E. Smith, "Phase Matching In Four-Layer Optical Waveguides", IEEE J. Quantum Electron., QE-4, 288 (1968).

E. Marcatelli, "Bends In Optical Dielectric Guides", Bell Syst. Tech. J. 48, 2103, 1969.

P. Sansonetti et al., "Low-Threshold GaAs/GaAlAs Buried Heterostructure Laser With An Ion-Beam Etched Laser With An Ion-Beam-Etched Quarter Ring Cavity", Electron Lett. 23, 485 (1987).

J. Butler et al., "Coupled-Mode Analysis Of Phase-Locked Injection Laser Arrays", Appl. Phys. Lett., 44, 293, 1984.

L. J. Guido, W. E. Plano, G. S. Jackson, N. Holonyak, Jr., R. D. Burnham, & J. E. Epler, "Coupled-Stripe $Al_xGa_{1-x}As$-GaAs Quantum Well Lasers Defined By Vacancy-Enhanced Impurity-Induced Layer Disordering From $(Si_2)_y (GaAs)_{1-y}$ Barriers", Appl. Phys. Lett. 50, 757 (1987).

J. S. Major, Jr., D. C. Hall, L. J. Guido, N. Holonyak Jr., P. Gavrilovic, K. Meehan, J. E. Williams, & W. Stutius, "High-Power Disorder-Defined Coupled Stripe $Al_yGa_{1-y}As$-GaAs-$In_xGa_{1-x}As$ Quantum Well Heterostructure Lasers", Appl. Phys. Lett. 55, 271 (1989).

J. Carran et al., "GaAs Lasers Utilizing Light Propagation Along Curved Junctions", IEEE J. Quantum Electron. QE-6 367 (1970).

A. S. H Liao et al., "Semiconductor Injetion Lasers With a Circular Resonator", Appl. Phys. Lett. 36, 801 (1980).

D. G. Deppe, G. S. Jackson, N. Holonyak, Jr., R. D. Burnham, & R. L. Thorton, "Coupled Stripe $Al_xGa_{1-x}As$-GaAs Quantum Well Lasers Defined By Impurity-Induced (Si) Layer Disordering", Appl. Phys. Lett. 50, 632 (1987).

R. D. Dupuis, et al., Proceedings of the International Symposium on GaAs and Related Compounds, "Preparation And Properties Of $Ga_{1-x}Al_xAs$-GaAs Heterojunctions Grown By Metallorganic Chemical Vapour Deposition", pp. 1–9, Inst. of Physics, London, 1979.

F. A. Kish, S. J. Caracci, S. A. Maranowski, N. Holonyak, Jr., S. C. Smith, & R. D. Burnham, "Planar native-oxide $Al_xGa_{1-x}As$-GaAs Quantum Well Heterostructure Ring Laser Diodes", Appl. Phys. Lett. 60, 1582 (1992).

Nathan et al., "GaAs Injection Laser With Novel Mode Control and Switching Properties", J. Appl. Phys. Lett. 36, 473 (1964).

N. K. Dutta et al., "Bistability in Coupled Cavity Semiconductor Lasers", Appl. Phys. Lett. 44, 30 (1984).

N. Yamada et al., "Strained InGaAs/GaAs Single Quantum Well Lasers With Saturable Absorbers fabricated By Quantum Well Intermixing", Appl. Phys. Lett. 60, 2463 (1992).

C. Harder et al., "Bistability And Pulsations In Semiconductor Lasers With Inhomogeneous Current Injection", IEEE J. of Quantum Electronics, vol. Qe-18, 1335 (1982).

D. G. Deppe et al., "Bistability In An AlAs-GaAs-InGaAs Vetical-Cavity Surface-Emitting Laser", Appl. Phys. Lett. 58, 2616 (1991).

K. Aiki et al, "Lasing Characteristics Of Disturbed-Feedback GaAs-GaAlAs Diode Lasers With Separate Optical And Carrier Confinement", IEEE J. of Quantum Electronics, vol. Qe-12, 597 (1976).

J. Jewell, "Surface-Emitting Lasers Reach R&D Threshold", Laser Focus World, May 1990, pp. 151–155.

D. R. Scifres, R. D. Burnham, & W. Streifer, Appl. Phys. Lett. 25, 203 (1974).

W. T. Tsang, "Lightwave Communications Technology, Part B, Semiconductor Injection Lasers, I", edited by W. T. Tsang in Semiconductors and Semimetals, vol. 22, edited by R. K. Willardson and A. C. Beer (Academic, Orlando, 1985), Chap. 5, pp. 257–373.

M. Kitamura, M. Yamaguchi, S. Murata, I. Mito, & K. Kobayashi, Electron. Lett. 20, 595 (1984).

D. G. Deppe, D. C. Hall, N. Holonyak, Jr., R. J. Mayti, H. Schichijo, & J. E. Epler, Appl. Phys. Lett. 53, 874 (1988).

H. G. Winful, J. H. Marburger, & E. Garmire, Appl. Phys. Lett. 35, 379 (1979).

J. He & M. Cada, IEEE J. Quantum Electron. Qe-27, 1182 (1991).

F. A. Kish, S. J. Caracci, N. Holonyak, Jr., K. C. Hsieh, J. E. Baker, S. A. Maranowski, A. R. Sugg, J. M. Dallesasse, R. M. Fletcher, C. P. Kuo, T. D. Osentowski, and M. G. Craford, Journal of Electronic Materials, vol. 21, No. 12, 1992.

A. R. Sugg, E. I. Chen, T. A. Richard, N. Holonyak, Jr., and K. C. Hsieh, Appl. Phys. Lett. 62 (11), 15 Mar. 1993.

A. R. Sugg, E. I. Chen, T. A. Richard, N. Holonyak, Jr., and K. C. Hsieh, J. Appl. Phys. 74 (2), 15 Jul. 1993.

S. A. Maranowski, A. R. Sugg, E. I. Chen, T. A. Richard, N. Holonyak, Jr., Appl. Phys. Lett. 63 (12), 20 Sep. 1993.

C. H. Henry, P. M. Petroff, R. A. Logan, and F. R. Meritt, J. Appl. Phys. 50, 3721 (1979).

Y. Suzuki, Y. Horikoshi, M. Kobayashi, and H. Okamoto, Electron. Lett. 20. 383 (1984).

R. L. Thornton, D. F. Welch, R. D. Burnham, T. L. Paoli, and P. S. Cross, Appl. Phys. Lett. 49, 1572 (1986).

W. D. Laidig, N. Holonyak, Jr., M. D. Camras, K. Hess, J. J. Coleman, P. D. Dapkus, and J. Bardeen, Appl. Phys. Lett. 38, 776 (1981).

D. G. Deppe and N. Holonyak, Jr., J. Appl. Phys. 64, R93 (1988).

J. Unger, N. Bar–Chaim, and I. Ury, Electron Lett. 22, 279 (1986).

T. Shibutani, M. Kume, K. Hamada, H. Shimizu, K. Itoh, G. Kano, and I. Terimoto, J. Quantum Electron QE–23, 760 (1987).

METHOD OF FABRICATING A SEMICONDUCTOR DEVICE BY OXIDIZING ALUMINUM-BEARING 1H-V SEMICONDUCTOR IN WATER VAPOR ENVIRONMENT

This invention was made with Government support under DAAL03-92-G-0264 awarded by the Department of the Army, and ECD 89-43166 and DMR 89-20538 awarded by the National Science Foundation. The Government has certain rights in this invention.

This is a continuation of copending U.S. application Ser. No. 08/224,838, filed Apr. 8, 1994, now pending.

FIELD OF THE INVENTION

This invention relates to the semiconductor devices and, more particularly, to methods of making semiconductor devices using III-V semiconductor materials, and to devices made using such methods.

BACKGROUND OF THE INVENTION

Semiconductor devices, for example, transistors, light emitters and detectors, fabricated using III-V semiconductor materials, have become scientifically and commercially important because of properties such as high speed, low loss, low noise operation, and relatively efficient generation and detection of light. For example, III-V light-emitting diodes and laser diodes are sold commercially for various applications.

So-called catastrophic optical damage (COD) and power saturation resulting from junction heating have long limited the maximum output powers available from semiconductor lasers [see C. H. Henry et al., J. Appl. Phys. 50, 3721 (1979)]. To alleviate these effects, a variety of different "window" lasers with higher COD levels have been successfully fabricated. The windows can serve to prevent damaging current levels at or near the laser facets (cleaves). These include non-absorbing windows formed by both Zn and Si impurity induced layer disordering (IILD) [see Y. Suzuki et al., Electron. Lett. 20, 383 (1984); R. L. Thornton et al., Appl. Phys. Lett. 49, 1572 (1986); W. D. Laidig et al., Appl. Phys. Lett. 38, 776 (1981); and D. G. Deppe and N. Holonyak, Jr., J. Appl. Phys. 64, R93 (1988)], or by etching and crystal regrowth [see J. Unger et al. Electron. Lett. 22, 279 (1986)]. Zn disordered windows typically suffer from significant free carrier absorption in the active layer. Windows formed by Si IILD or by etching and crystal regrowth are limited more by scattering losses near the window transition region, resulting in increased laser thresholds and decreased efficiencies. Smaller improvements in the COD level have also been demonstrated with absorbing current blocking windows [see T. Shibutani et al., J. Quantum Electron. QE-23, 760 (1987)]. In all of the above cases, the window regions are defined by planar or non-planar processing (of varying complexity), followed by cleaving of laser bars near the center of the window regions. This necessarily results in windows of varying length that are large enough to cleave easily.

It is among the objects of the present invention to improve fabrication of III-V semiconductor light emitting devices and other devices to facilitate their fabrication, and to obtain devices having improved operating characteristics and improved reliability and life.

In the fabrication of III-V semiconductor devices, it is typical to deposit layers on a substrate to form a structure of relatively large surface area (sometimes called a "crystal") that is processed and is separated, such as by cleaving and/or sawing and/or etching, into many individual devices, or groups of devices, of relatively small area. [These may sometimes remain on a common base.] Applicant has found that the separating of the crystal, and/or other processing operations, can result in microscopic cracks and other structural defects that have a deleterious effect on ultimate operation of the devices being fabricated.

It is also among the objects of the present invention to improve fabrication of III-V semiconductor devices to minimize the effects of structural defects.

SUMMARY OF THE INVENTION

The present invention relates to improved techniques and devices employing, inter alia, an aluminum-bearing III-V semiconductor material and a native oxide of aluminum that is formed in the semiconductor material.

In the U.S. Pat. No. 5,262,360 of N. Holonyak, Jr. and J. Dallesasse, assigned to the same assignee as the assignee of the present application, there is disclosed a technique of forming a high quality, stable, and compact native oxide layer from an aluminum-bearing Group III-V semiconductor material. [Reference can also be made to Dallesasse et al., Appl. Phys. Lett. 57 (26), 2844–6, 24 Dec. 1990; Dallesasse et al., Appl. Phys. Lett. 58 (4), 394–396, 28 Jan. 1991; Dallesasse et al., Appl. Phys. Lett.58 (8), 834–836, 25 Feb. 1991; and Sugg et al., Appl. Phys. Lett.58 (11), 1199–1201, 18 Mar. 1991.] The technique comprises exposing an aluminum-bearing Group III-V semiconductor material to a water-containing environment and a temperature of at least about 375° C. to convert at least a portion of the aluminum-bearing Group III-V semiconductor material to a native oxide. The thickness of said native oxide formed thereby is substantially the same as or less than the thickness of that portion of said aluminum-bearing III-V semiconductor material converted into the native oxide. The native oxide layer thus grown is more stable than oxide layers formed from previous methods, meaning, for example, that they do not degrade under conditions of normal use and atmospheric exposure. Further, the native oxide was demonstrated to exhibit improved operating and performance characteristics, for example with regard to metallization adherence and dielectric properties. The native oxides were described as being useful in lasers, transistors, capacitors, waveguides and in other electrical and optoelectrical devices. Anhydrous oxides of aluminum were noted to exhibit a relatively low index of refraction (less than about 2.0) and index of refraction can be used to distinguish the anhydrous oxide forms from the higher index hydrated oxide forms that are generally unsuitable for semiconductor applications due to properties such as expansion and instability.

Applicant has discovered that by implementing oxidation to obtain a native oxide of aluminum after a device (or devices) has been metallized (and device fabrication would normally be complete or virtually complete), advantages can be obtained in device operation, reliability, and life. In addition to the advantages that will be shown to accrue from selectively oxidizing relatively higher aluminum composition material in the device after fabrication is almost complete, the oxidation-after-metallization hereof also provides a sealing effect on the device, acting to seal cracks and other defects which are present in the processed device. Not only does the formation of insulating native oxide material in cracks and defects minimize undesirable carrier flow at such defects, but a degenerative effect, whereby such current leads to still further damage, is reduced or eliminated. Also, the presence of the resultant relatively stable native oxide in these defects reduces or eliminates the deleterious longer term oxidation (hydrolyzation), which can lead to deterioration of the device.

In accordance with an embodiment of the invention there is disclosed a method of making a semiconductor device, comprising the following steps: forming a structure comprising layers of III-V semiconductor material, at least one of said layers being an aluminum-bearing III-V semiconductor material; applying metal electrodes to said structure to form a metallized semiconductor structure; and heating said metallized structure in a water-containing environment to convert a portion of the aluminum-bearing III-V semiconductor material to a native oxide of aluminum. [As used herein, metal electrodes and metallization includes electrically conductive metals and materials containing such conductive metals.] In a preferred embodiment of the invention, the heating step comprises heating to a temperature of at least 375° C. in an environment which comprises an inert gas and water vapor. The heating is preferably to a temperature that is less than a temperature at which said electrodes would deform. In most, but not all, cases, heating will be to a temperature that is less than 550° C.

In accordance with a further form of the invention, a method is set forth for making a semiconductor laser device, comprising the following steps: a) depositing successive layers of III-V semiconductor material to obtain a lower confining region, an active region, and an upper confining region, at least one of said confining regions including a layer of aluminum-bearing III-V semiconductor material; b) applying upper and lower metallizations to the structure obtained in step (a), said upper metallization including a plurality of stripes in contact with the structure obtained in step (a); c) cleaving the structure obtained in step (b) across said stripes; and d) heating the metallized structure in a water-containing environment to convert a portion of the aluminum-bearing III-V semiconductor material to native oxide of aluminum. In an embodiment of this form of the invention, at least one of the confining regions is formed by depositing layers of aluminum-bearing III-V semiconductor material having different aluminum fractions. In this embodiment, the layers of aluminum-bearing III-V semiconductor material are aluminum gallium arsenide, and the heating step comprises heating for a time sufficient to form a lateral oxide spike in the higher aluminum fraction layer.

Further features and advantages of the invention will become more readily apparent from the following detailed description when taken in conjunction with the accompanying drawings.

DETAILED DESCRIPTION

In an example of an embodiment hereof, a quantum well heterostructure crystal is grown by low-pressure metalorganic chemical vapor deposition (MOCVD) [see R. D. Dupius et al., in Proceedings of the International Symposium on GaAs and Related Compounds, edited by C. M. Wolfe (Institute of Physics, London, 1979), pp. 1–9; M. J. Ludowise, J. Appl. Phys. 58, R31 (1985)] on (100) n-type GaAs substrates in a modified Emcore GS 3000 reactor. The growth pressure is ~90 Torr and the growth temperature is 760° C. The dopant sources used are $Si_2H_6$ and $CCl_4$. A ~0.1 μm n-type GaAs buffer layer is grown first, followed by an n-type composite lower confining layer of ~0.5 μm $Al_{0.7}Ga_{0.3}As$ and ~0.5 μm $Al_{0.4}Ga_{0.6}As$. A 2000 Angstrom waveguide region is grown next, and has a 75 Angstrom strained layer of $In_yGa_{1-y}As$ (λ of about 960 nm) quantum well centered in 960 Angstroms of GaAs, which is further confined by 480 Angstroms of $Al_{0.15}Ga_{0.85}As$ on either side. The p-type upper confining layer consists of first ~0.5 μm of $Al_{0.4}Ga_{0.6}As$ and then ~1000 Angstrom of $Al_{0.9}Ga_{0.1}As$ (the layer for subsequent oxidation) sandwiched inside a pair of ~1500 Angstrom $Al_{0.7}Ga_{0.3}As$ layers. Finally, a ~1000 Angstrom p-type GaAs capping layer is grown that includes a heavily carbon-doped contact layer grown at 550° C.

In the present example, laser fabrication begins with the patterning of ~12 μm-wide photoresist stripes on the crystal surface. The stripes mask mesa etching (1:8:160, $H_2SO_4:H_2O_2:H_2O$, 2.5 min) that removes all but ~1500 Angstrom of the p-type upper confining layer outside the stripes, resulting in ~10.5 μm-wide ridges. The photoresist is then removed, and a $Si_3N_4$ layer is deposited over the entire crystal by chemical vapor deposition at 700° C. Another photolithographic step and $CF_4$ plasma etching are used to define ~4 μm contact openings in the $Si_3N_4$ centered on the 10.5 μm ridges. After the photoresist is again removed, the crystal is lapped to ~100 μm and polished. The n-side metallization is performed next, and consists of a Ge-Ag-In alloy (600° C., 10 s), followed by the Ti-Pt-Au p-side metallization. The crystal is then cleaved into bars (~500 μm-long cavities) that are ready for oxidation.

Figure 1:
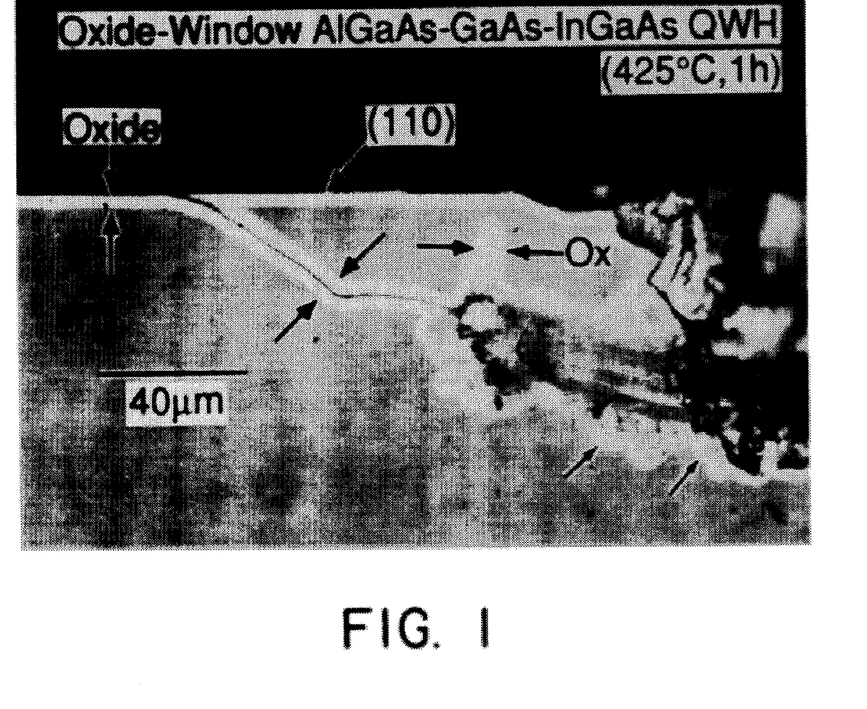
FIG. 1 is a photograph of the surface of a cleaved $Al_xGa_{1-x}As$-GaAs-$In_yGa_{1-y}As$ QWH crystal after "wet" oxidation (425° C., 1 h). The buried oxide forms anisotropically, starting at the exposed edges of an $Al_{0.9}Ga_{0.1}As$ layer and proceeding laterally into the crystal. The edges occur along the (110) cleave and along cracks at the surface of the crystal. Arrows are used to delineate the oxidized regions.

Some of the metallized bars are placed in an oxidation furnace (425° C.) that is supplied with a $H_2O$-vapor saturated $N_2$ flow. Also, samples of unprocessed crystal (bare surface) with freshly cleaved edges are simultaneously placed in the oxidation furnace to provide comparison samples. A photograph of the surface of the unprocessed crystal after oxidation at 425° C. for 1 h is shown in FIG. 1. The right side of the photograph shows the rough scribe mark used to initiate the crystal cleaving. One part of the scribe mark causes a crack to propagate along the crystal surface (diagonally to the left) before reaching the (110) cleave edge. In the regions where high composition $Al_xGa_{1-x}As$ is exposed, i.e., along the scribe mark, along cracks, and along the cleaved edge, the $Al_xGa_{1-x}As$ is converted to a high-quality insulating native oxide as shown in the top view of FIG. 1. The oxidation is anisotropic, preferentially "consuming" the $Al_{0.9}Ga_{0.1}As$ layer near the crystal edges (as well as cracks and crevices) and proceeding ~4 μm laterally under the lower composition cap layers. The extent of the oxide is visible from the crystal surface since the low index (n~1.63) of the native oxide makes the oxidized regions more reflective than the rest of the crystal. The GaAs cap layer provides an effective mask for surface oxidation at 425° C. [see J. M. Dallesasse et al. Appl. Phys. Lett. 58, 394 (1991)]. As is evident in FIG. 1, the oxide tends to electrically isolate small cracks ("Ox" label—visible in original) that are barely visible on the crystal surface. Thus, the oxide forms a seal or "guard ring" that tends to block current injection from damaged areas of the crystal.

The oxidation conditions control the amount (extent) of electrical isolation near cleaved (110) edges. Three photographs of the QWH crystal surface are compared in FIG. 2. The (a) photograph shows a cleaved edge of the as-grown crystal, while the (b) and (c) photographs are of samples (unprocessed crystals) that are cleaved and oxidized at 425° C. for 1 and 2 hours, respectively. The laterally grown oxide extends (b) ~3.5 and (c) ~7 μm from the (110) cleave edge into the crystal. For longer oxidation times, the anisotropic oxide layer thickens near the cleave edge as the $Al_{0.7}Ga_{0.3}As$ layers surrounding the $Al_{0.9}Ga_{0.1}As$ layer begin to oxidize. This is evident in FIG. 2 (c) as a darkening adjacent to the (110) edge.

Figure 3:
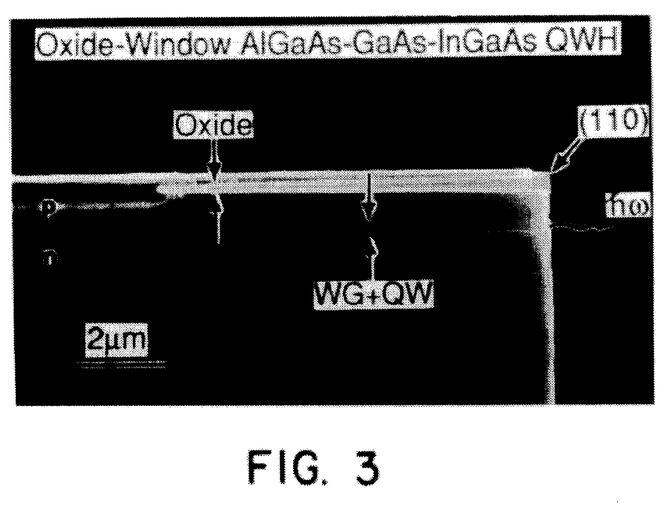
FIG. 3 is a scanning electron microscope (SEM) image of a stained cross section of a QWH crystal that is edge oxidized from a cleaved surface (425° C. 2 h) The oxidation consumes ~7.5 μm of the exposed $Al_{0.9}Ga_{0.1}As$ layer as the reaction proceeds laterally (to the left) into the crystal. The oxide spike widens near the cleave edge as the surrounding $Al_{0.7}Ga_{0.3}As$ layers begin to oxidize.

A scanning electron microscope (SEM) image of a stained crystal cross section is shown in FIG. 3. An unprocessed QWH crystal is cleaved and laterally oxidized (425° C., 2 h). The resulting oxide shown in FIG. 3 is ~7.5 μm long and varies continuously in thickness from ~0.45 μm at the (110) cleave edge to ~1000 Å at the tip of the oxide spike. The anisotropic nature of the oxidation results in rapid oxidation of the thin (~1000 Å) $Al_{0.9}Ga_{0.1}As$ layer, and more gradual oxidation of the surrounding $Al_{0.7}Ga_{0.3}As$ layers. Both the waveguide and surrounding $Al_{0.4}Ga_{0.6}As$ layers remain essentially unoxidized since they are of lower aluminum composition. The bright line that appears to the left of the oxide spike in FIG. 3 is an artifact of staining.

Figure 2:
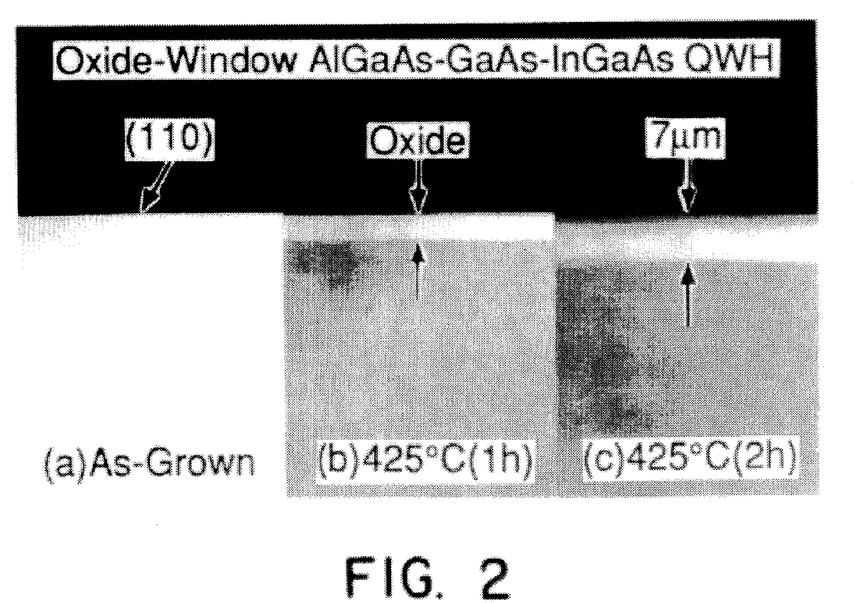
FIG. 2 is a photograph (top view) of the (110) cleaved edge of an $Al_xGa_{1-x}As$-GaAs-$In_yGa_{1-y}As$ QWH (a) as-grown (b) oxidized (425° C, 1 h), and (c) oxidized (425° C., 2 h). The oxide extends ~3.5 μm into the crystal in (b), and ∥7 μm into the crystal for the longer oxidation time of (c).

The metallized bars are assumed to oxidize exactly lake the comparison samples presented in FIGS. 1–3, since the initial conditions (freshly cleaved edges) and the oxidation times and temperatures are held constant. Also, Applicant's experience with actual cross sections shows no differences in the oxidation behavior of metallized and non-metallized specimens. The oxidation temperature is low enough to avoid melting or re-alloying of the metallizations.

Light vs. current (L-I) characteristics (pulsed excitation, 1% duty cycle) of the metallized $Al_xGa_{1-x}As$-GaAs-$In_yGa_{1-y}As$ QWH laser diodes are measured prior to "window" oxidation. On each bar individual devices are isolated by shallow saw cuts. Typical threshold currents for these 10.5-μm-wide ridge-waveguide devices are ~25 mA for ~500-μm-long cavities. After the oxidation procedure that forms the current-blocking facet windows, the L-I characteristics of each diode are measured again. For bars that are oxidized at 425° C. for 1 h (~4-μm-long windows), the threshold currents typically increase by ~0.5 mA. Threshold currents of bars oxidized at 425° C. for 2 h (~7.5-μm-long windows) or at 450° C. for 45 min (~6.5-μm-long windows) increase by μ1.5 mA. The differential quantum efficiency remains almost unchanged after all oxidations. Losses in the unpumped window regions cause the slightly larger pulsed threshold currents of the oxidized laser bars. The current-voltage (I–V) characteristics are unaffected by the oxidation process. The series resistance of the diodes is about 3 ohms.

Figure 4:
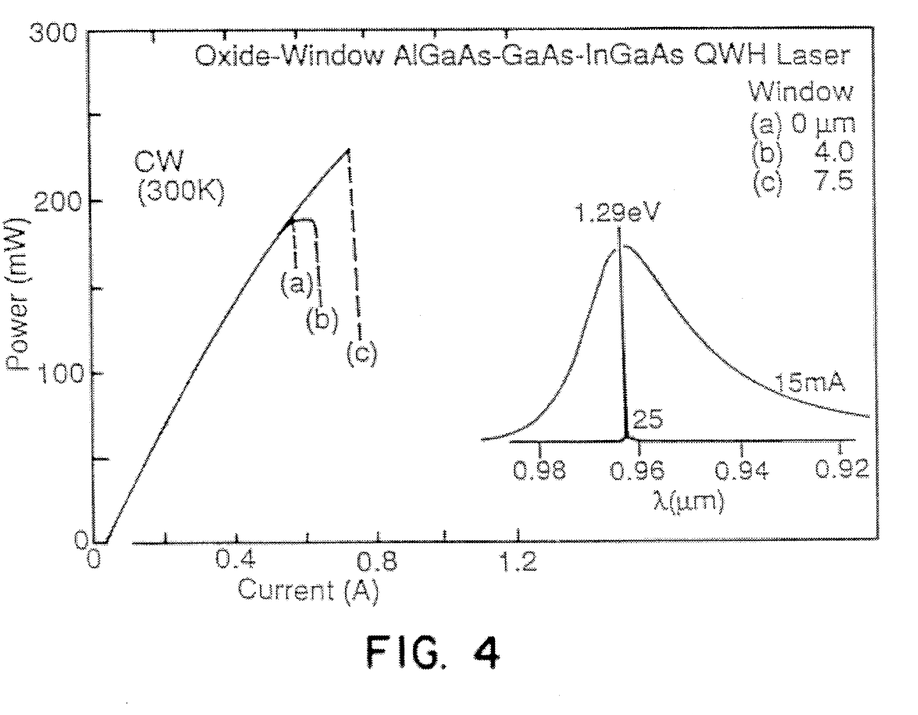
FIG. 4 shows continuous 300K L-I curves for oxide-window $Al_xGa_{1-x}As$-GaAs-$In_yGa_{1-y}As$ QWH lasers (see FIG. 3) with (a) no windows, (b) ~4-μm-long windows, and (c) ~7.5-μm-long windows. The longer windows effectively reduce the heating at the laser facets, resulting in increased maximum output powers. For reference, the inset shows the longitudinal mode spectra of a non-window device below threshold (15 mA) and above threshold (25 mA).

After the window oxidations are complete, the laser bars are diced and the individual diodes are mounted p-side down on In-coated copper heat sinks for continuous wave (cw) operation. Six comparison non-window diodes (from four different unoxidized bars) are also mounted. All of the non-window devices are driven cw until burn out by COD. The power at which COD occurs varies from 150 to 192 mw/facet for uncoated non-window lasers. The L-I characteristic (cw 300K) of the best (highest power) non-window device tested is shown in FIG. 4(a). This device fails by COD (192 mw/facet) at a current of 580 mA (10.5 kA/cm$^2$).

A typical L-I characteristic for an oxide-window (~4 μm-long window) device is shown in FIG. 4(b). Before COD occurs, these devices typically operate to ~190 mw/facet, a power equal to that of the best non-window devices. However, the devices with 4 μm-long windows do not fail abruptly at this power. Instead, heating causes the L-I curve to bend, with failure by COD at 690 mA (12.8 kA/cm$^2$). This is a 20% larger current density at failure than any of the non-window devices tested.

The L-I characteristic of a typical oxide-window QWH diode with longer (~7.5 μm) windows is shown in FIG. 4(c). This diode operates to 232 mW/facet before catastrophic failure at a current density of 15 kA/cm$^2$. The longer windows are more effective at blocking the current injection (and reducing heating) near the laser facets, resulting in higher maximum output powers than the shorter window lasers. The best device with longer windows operates (without failure) to 248 mW/facet at a current of ~1.1 A (18.2 kA/cm$^2$). This is a ~25% improvement in maximum output power over the best non-window device. The total external differential quantum efficiency (η) is ~60% for all three devices (~500 μm cavities) shown in FIG. 4. The threshold currents of all three devices are 24–26 mA. The inset of FIG. 4 shows the longitudinal mode spectra of a non-window device below threshold at 15 mA, and above threshold at 25 mA.

Near field (NF) patterns of both the window and non-window devices are typically single-lobed, with a full width at half-maximum (FWHM) of 10–11 μm. This FWHM corresponds to the width (~10.5 μm) of these ridge waveguide devices. The windows investigated in this example are too short to cause a broadening of the NF, which reduces the power density at the laser facets and further increases the maximum output power. Therefore, it is believed that most of the improvement in the window devices of this example can be attributed to reduced heating at the laser facets, i.e., a reduction in current injection near the cleaved edges of the device.

Figure 5:
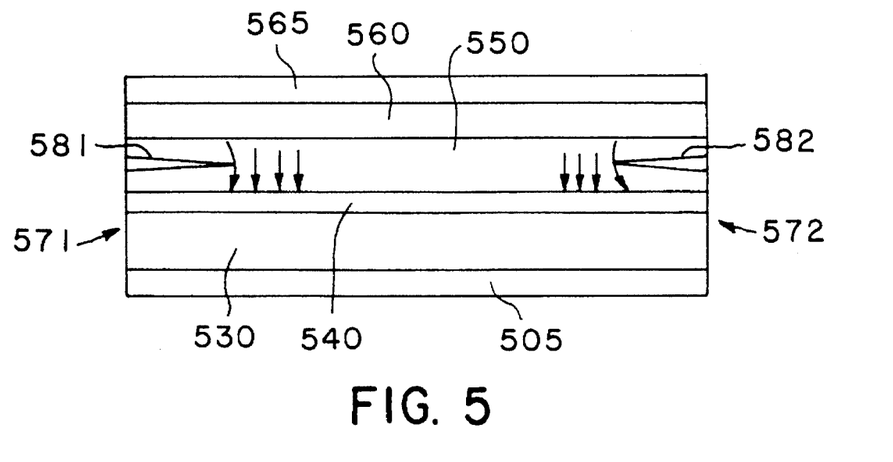
FIG. 5 is simplified cross-sectional view of the laser device described in conjunction with FIG. 1–4, and fabricated in accordance with an embodiment of the method of the invention.

FIG. 5 is a simplified cross-sectional diagram of a metallized and oxidized device fabricated as described above. The cross-section is taken longitudinally along the laser stripe. In the FIG. 5 diagram the bottom electrode is labelled 505, the n-type lower confining layers are labelled 530, and the layers of the active region (at the p-n junction, where carrier recombination occurs and light is produced) are represented at 540. The p-type upper confining layers are labelled 550, and the conductive cap layer is labelled 560 and the upper metallization is labelled 565. The left edge cleave is labelled 571 and the right edge cleave is labelled 572. In the illustration of FIG. 5, the oxidation spikes (windows) are formed, as described above, by lateral oxidation mostly in the 1000 Angstrom high-aluminum-content layer of the upper confining region, and are represented at 581 and 582, respectively. The small vertical arrows represent current and illustrate how windows are generally understood to reduce current flow near the cleaved facets.

The foregoing example illustrates the advantages of the invention in a III-V semiconductor laser, but it will be understood that advantages can also accrue in other III-V semiconductor devices, examples being non-lasing light emitters (such as light emitting diodes), light detectors (such as photodiodes), and transistors (such as field-effect transistors).

Figure 6:
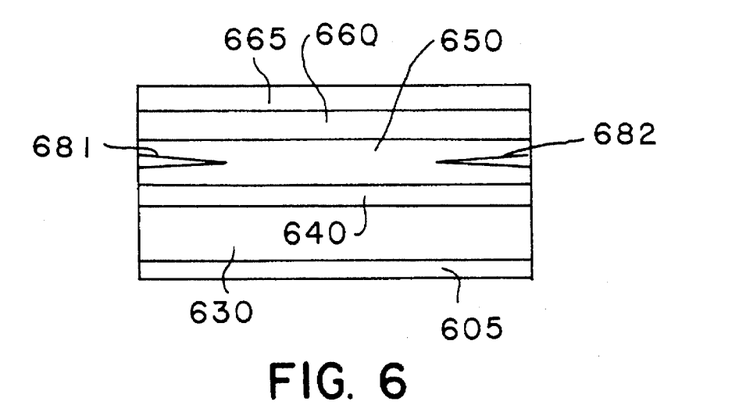
FIG. 6 is a simplified cross-sectional view of a light-emitting diode device that can be fabricated in accordance with an embodiment of the method of the invention.

FIG. 6 illustrates, in simplified form, an example of a light emitting diode of a type that can be fabricated using the technique of the invention. In this example, the structure can be similar in geometry and materials to that of the laser diode described in conjunction with FIGS. 1–5, except that there are no cleaved facets. The light emitting diode includes the following structure: bottom electrode 605, n-type lower confining layers 630, active region layers 640, p-type upper confining layers 650, conductive cap layer 660, and upper metallization 665.

In the case of this light emitting diode, fabrication can be similar to that of the laser diode example, but cleaving to get reflective facets is not necessary, so division of a crystal into pieces can be implemented, for example, by sawing and/or etching. Also, typically, the top electrode will not include a stripe, and may, for example, have an aperture for light to escape, although light can be emitted from any part (e.g. top, bottom, or sides) of the device. In this example, the diode has oxide spikes which are formed as previously described and can, again, advantageously reduce current near the device edges to improve reliability and life of the device. The beneficial sealing effect at or near the end of processing, and after metallization, provides the same type of advantages previously described; i.e.; the oxidation of the device serves to seal cracks and other structural defects in any portion of the device formed of aluminum-bearing III-V material that is exposed to the oxidation directly or via cracks or oxidation growth.

Figure 7:
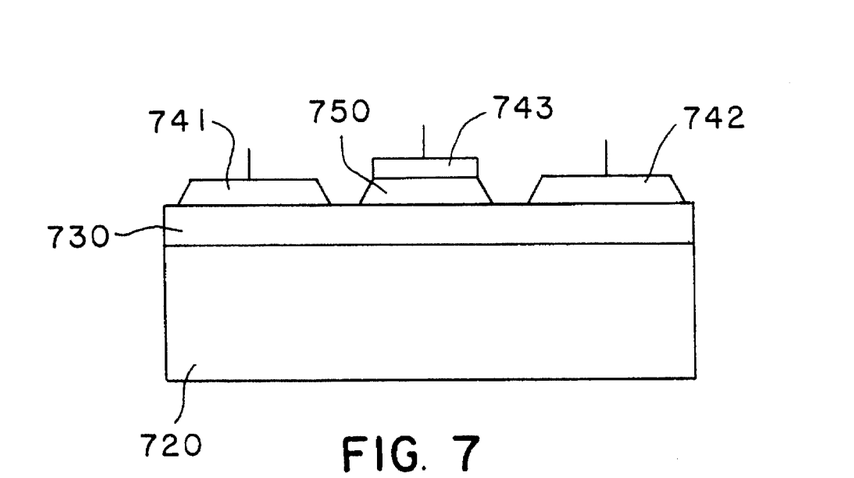
FIG. 7 is a simplified cross-sectional view of a transistor device that can be fabricated in accordance with an embodiment of the method of the invention.

FIG. 7 illustrates, in simplified form, a field-effect transistor which can be fabricated using a technique of the invention wherein aluminum-bearing III-V semiconductor material in region(s) of the device are oxidized after metallization to obtain a native oxide. In FIG. 7 a channel region 730 is deposited on a substrate 720, and source, drain, and gate regions are defined under metallized electrodes 741, 742 and 743, respectively. Appropriate diffusions (not shown) can be provided at the source and drain. In the illustrated example, a layer of relatively high aluminum fraction (e.g. $Al_{0.9}Ga_{0.1}As$) aluminum gallium arsenide can be deposited and defined over the gate region prior to metallization. Then, after metallization (and, if desired, division of a crystal with multiple devices formed thereon), wet oxidation can be implemented, in the manner previously described, to form a high quality insulating layer 750 between gate electrode and channel. Again, the oxidation of the device serves to seal cracks and other structural defects in any portion of the device formed of aluminum-bearing III-V material that is exposed to the oxidation directly or via cracks or oxidation growth.

The invention has been described with reference to particular preferred embodiments, but variations within the spirit and scope of the invention will occur to those skilled in the art. For example, it will be understood that the techniques hereof can be applicable to fabricating other device configurations and that other materials can be employed, consistent with the claims set forth.

We claim:

1. A method of making a semiconductor device, comprising the steps of:

forming a structure comprising layers of III-V semiconductor material, at least one of said layers being an aluminum-bearing III-V semiconductor material;

applying metal electrodes to said structure to form a metallized semiconductor structure; and heating said metallized structure in a water-containing environment to convert a portion of the aluminum-bearing III-V semiconductor material to a native oxide of aluminum.

2. The method as defined by claim 1, wherein said heating step comprises heating to a temperature of at least 375° C.

3. The method as defined by claim 1, wherein said environment comprises an inert gas and water vapor.

4. The method as defined by claim 2, wherein said environment comprises an inert gas and water vapor.

5. The method as defined by claim 4, wherein said heating step comprises heating to a temperature that is less than a temperature at which said electrodes would deform.

6. The method as defined by claim 4, wherein said heating step comprises heating to a temperature that is less than 550° C.

7. The method as defined by claim 1, further comprising the step of separating said metallized structure into several pieces before said heating step.

8. The method as defined by claim 4, further comprising the step of separating said metallized structure into several pieces before said heating step.

9. The method as defined by claim 4, wherein said step of forming a structure comprising layers of III-V semiconductor material comprises depositing at least a plurality of layers of aluminum-bearing III-V material having different aluminum fractions.

10. A method of making a semiconductor light-emitting device, comprising the steps of:

forming a structure comprising regions of III-V semiconductor material of opposite conductivity type, at least one of said regions comprising an aluminum-bearing III-V semiconductor material;

applying metal electrodes to said structure which are electrically coupled with said regions, to form a metallized structure; and heating said metallized structure in a water-containing environment to convert a portion of the aluminum-bearing III-V semiconductor material to a native oxide of aluminum.

11. The method as defined by claim 10, wherein said heating step comprises heating to a temperature of at least 375° C.

12. The method as defined by claim 10, wherein said environment comprises an inert gas and water vapor.

13. The method as defined by claim 12, wherein said environment comprises an inert gas and water vapor.

14. The method as defined by claim 13, further comprising the step of separating said metallized structure into several pieces before said heating step.

15. A method of making a semiconductor light-emitting device, comprising the steps of:

forming a structure comprising: at least one semiconductor layer that defines a lower confining region; at least one semiconductor layer that defines an upper confining region; and at least one semiconductor layer between said lower and upper confining regions that defines a semiconductor active region; at least one of said confining regions including a layer of aluminum-bearing III-V semiconductor material;

applying lower and upper metal electrodes to said structure that are electrically coupled with said lower and upper confining regions, respectively; and heating the metallized structure in a water-containing environment to convert a portion of the aluminum-bearing III-V semiconductor material to a native oxide of aluminum.

16. The method as defined by claim 15, wherein said heating step comprises heating to a temperature of at least 375° C.

17. The method as defined by claim 16, wherein said environment comprises an inert gas and water vapor.

18. The method as defined by claim 17, further comprising cleaving said structure into pieces before said heating step.

19. The method as defined by claim 17 wherein said upper metal electrode comprises parallel stripes, and further comprising cleaving said structure across said stripes before said heating step.

20. A method of making a semiconductor laser, comprising the steps of:

a) depositing successive layers of III-V semiconductor material to obtain a lower confining region, an active region, and an upper confining region, at least one of said confining regions including a layer of aluminum-bearing III-V semiconductor material;

b) applying upper and lower metallizations to the structure obtained in step (a), said upper metallization including a plurality of stripes coupled with the structure obtained in step (a);

c) cleaving the structure obtained in step (b) across said stripes; and d) heating the metallized structure in a water-containing environment to convert a portion of the aluminum-bearing III-V semiconductor material to native oxide of aluminum.

21. The method as defined by claim 20, wherein at least one of confining regions is formed by depositing layers of aluminum-bearing III-V semiconductor material having different aluminum fractions.

22. The method as defined by claim 21, wherein said layers of aluminum-bearing III-V semiconductor material are aluminum gallium arsenide, and wherein said heating step comprises heating for a time sufficient to form a lateral oxide spike in the higher aluminum fraction layer.

23. The method as defined by claim 20, wherein said heating step comprises heating to a temperature of at least 375° C. in an environment comprising an inert gas and water vapor.

24. The method as defined by claim 21, wherein said heating step comprises heating to a temperature of at least 375° C. in an environment comprising an inert gas and water vapor.

* * * * *